United States Patent
Komanduri et al.

(10) Patent No.: US 10,332,443 B2
(45) Date of Patent: Jun. 25, 2019

(54) LUMINAIRE AND LIGHTING SYSTEM, COMBINING TRANSPARENT LIGHTING DEVICE AND DISPLAY COUPLED TO OUTPUT IMAGE VIA THE TRANSPARENT LIGHTING DEVICE

(71) Applicant: ABL IP HOLDING LLC, Conyers, GA (US)

(72) Inventors: Ravi Kumar Komanduri, Ashburn, VA (US); Gregory Malone, Herndon, VA (US); David P. Ramer, Reston, VA (US); Rashmi Kumar Raj, Herndon, VA (US)

(73) Assignee: ABL IP HOLDING LLC, Conyers, GA (US)

( * ) Notice: Subject to any disclaimer, the term of this patent is extended or adjusted under 35 U.S.C. 154(b) by 114 days.

(21) Appl. No.: 15/424,208

(22) Filed: Feb. 3, 2017

(65) Prior Publication Data

US 2018/0226014 A1  Aug. 9, 2018

(51) Int. Cl.
*G09G 3/32* (2016.01)
*F21V 8/00* (2006.01)
(Continued)

(52) U.S. Cl.
CPC .............. *G09G 3/32* (2013.01); *G02B 6/0036* (2013.01); *G02B 6/0051* (2013.01); *G02B 6/0061* (2013.01); *G02B 6/0073* (2013.01); *G09G 3/20* (2013.01); *H01L 51/5206* (2013.01); *H01L 51/5221* (2013.01); *H01L 51/5262* (2013.01);
(Continued)

(58) Field of Classification Search
None
See application file for complete search history.

(56) References Cited

U.S. PATENT DOCUMENTS

2009/0262545 A1  10/2009  Amelung et al.
2010/0066941 A1  3/2010  Duong et al.
(Continued)

FOREIGN PATENT DOCUMENTS

GB          2535482 A      8/2016

OTHER PUBLICATIONS

International Search Report and Written Opinion for International Application No. PCT/US18/15888, dated Apr. 13, 2018, 14 pages.
(Continued)

*Primary Examiner* — Nicholas J Lee
(74) *Attorney, Agent, or Firm* — RatnerPrestia

(57) ABSTRACT

Examples of a lighting and display type luminaire use relatively transparent lighting devices. In such a luminaire, a light transmissive element of the lighting device is coupled to an output of a display device. For example, an edge lit lighting device includes an optical waveguide and one or more illumination light sources coupled to supply light to/through a surface along an edge or periphery of the waveguide. The waveguide allows emission of illumination light through a front surface. A display is coupled to a back surface of the waveguide. During display operations, the waveguide is sufficiently transparent to allow image display light to pass through the waveguide for emission through the front surface of the waveguide. Another example utilizes a light transmissive OLED (organic light emitting diode) panel as the relatively transparent lighting device.

26 Claims, 6 Drawing Sheets

(51) Int. Cl.
*H01L 51/52* (2006.01)
*H05B 33/08* (2006.01)
*G09G 3/20* (2006.01)

(52) U.S. Cl.
CPC ..... *H01L 51/5271* (2013.01); *H05B 33/0896* (2013.01); *G09G 2340/02* (2013.01); *G09G 2340/0407* (2013.01)

(56) References Cited

U.S. PATENT DOCUMENTS

| | | | |
|---|---|---|---|
| 2012/0091923 | A1 | 4/2012 | Kastner-Jung et al. |
| 2013/0043803 | A1 | 2/2013 | Raj |
| 2013/0301249 | A1 | 11/2013 | Ngai et al. |
| 2013/0334559 | A1 | 12/2013 | Vdovin et al. |
| 2013/0334972 | A1 | 12/2013 | Atkins |
| 2014/0268766 | A1 | 9/2014 | Lu |
| 2014/0313765 | A1 | 10/2014 | Nelson et al. |
| 2015/0219825 | A1 | 8/2015 | Wu et al. |
| 2015/0228696 | A1 | 8/2015 | Diekmann et al. |
| 2015/0300583 | A1 | 10/2015 | McCanlesss et al. |
| 2016/0217749 | A1 | 7/2016 | Aggarwal et al. |
| 2016/0356940 | A1 | 12/2016 | Ngai |
| 2017/0018214 | A1 | 1/2017 | Black et al. |
| 2017/0018215 | A1 | 1/2017 | Black et al. |
| 2017/0018256 | A1 | 1/2017 | Rains, Jr. et al. |
| 2017/0059151 | A1 | 3/2017 | Black et al. |
| 2017/0061904 | A1 | 3/2017 | Lin et al. |
| 2017/0061905 | A1 | 3/2017 | Lin et al. |
| 2017/0076677 | A1 | 3/2017 | Lin et al. |

OTHER PUBLICATIONS

Beam Labs, "Screw it in and have fun!", http://beamlabsinc.com, printed Jan. 12, 2017, © 2016 Beam labs BV, The Netherlands, 5 pages.

"Geode: Make your own photos glow with this LED light by Reid—Kickstarter," https://www.kickstarter.com/projects/pseudoreid/geode-rechargeable-led-light-makes-your . . . , printed Jan. 12, 2017, © 2017, 14 pages.

"Peerless® Lighting for People, Vellum LED," © 2014-2017 Acuity Brands Lighting, Inc., PeerlessLighting.com, Rev. Dec. 14, 2016, pp. 1-6, 6 pages.

Matthias Bues et al., "Convergence of Lighting and Display: Opportunities, Requirements, Challenges," Fraunhofer Institute for Industrial Engineering (IAO), Stuttgart, Germany, SID 2016 Digest, ISSN 0097-96X/16/4701-0110, © 2016 SID, pp. 110-113, 4 pages.

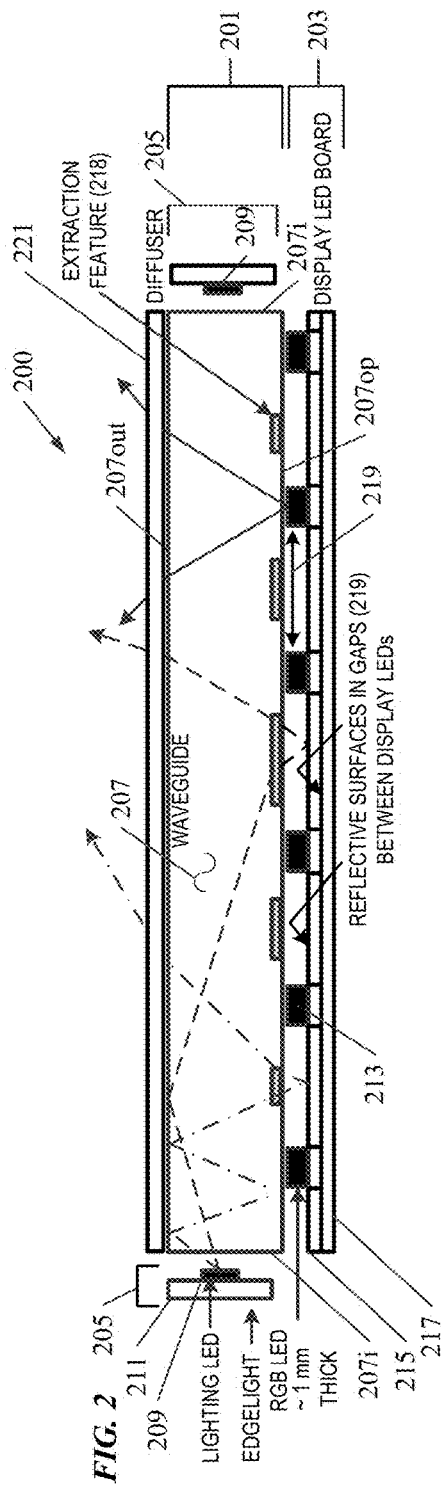
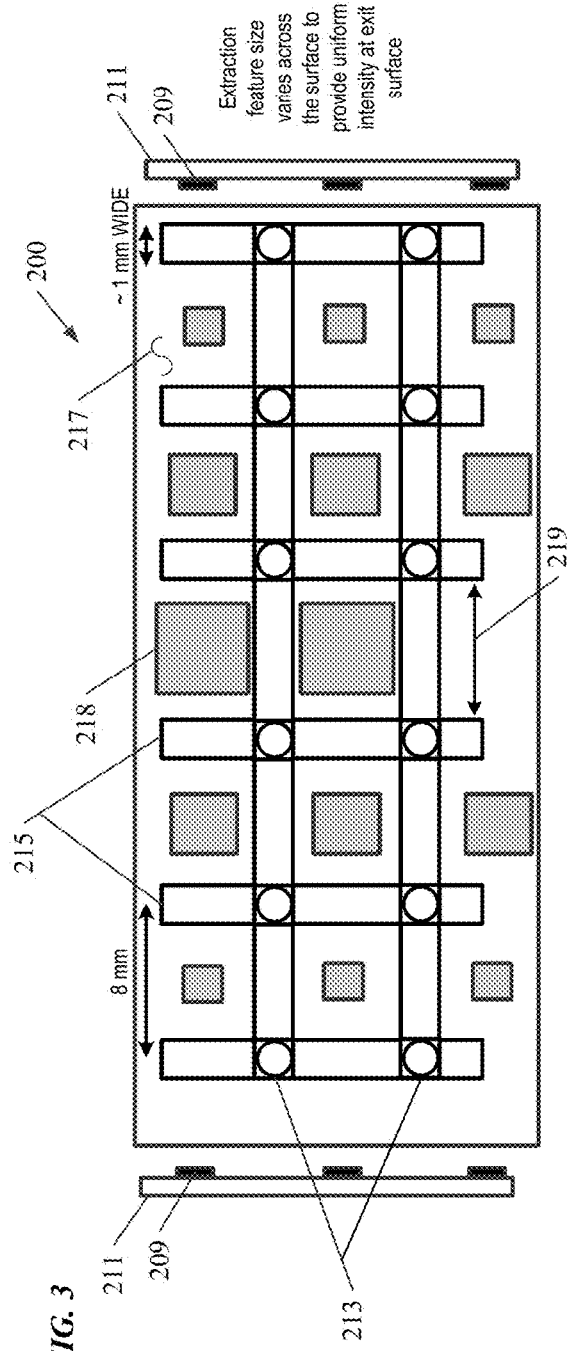
FIG. 2
FIG. 3

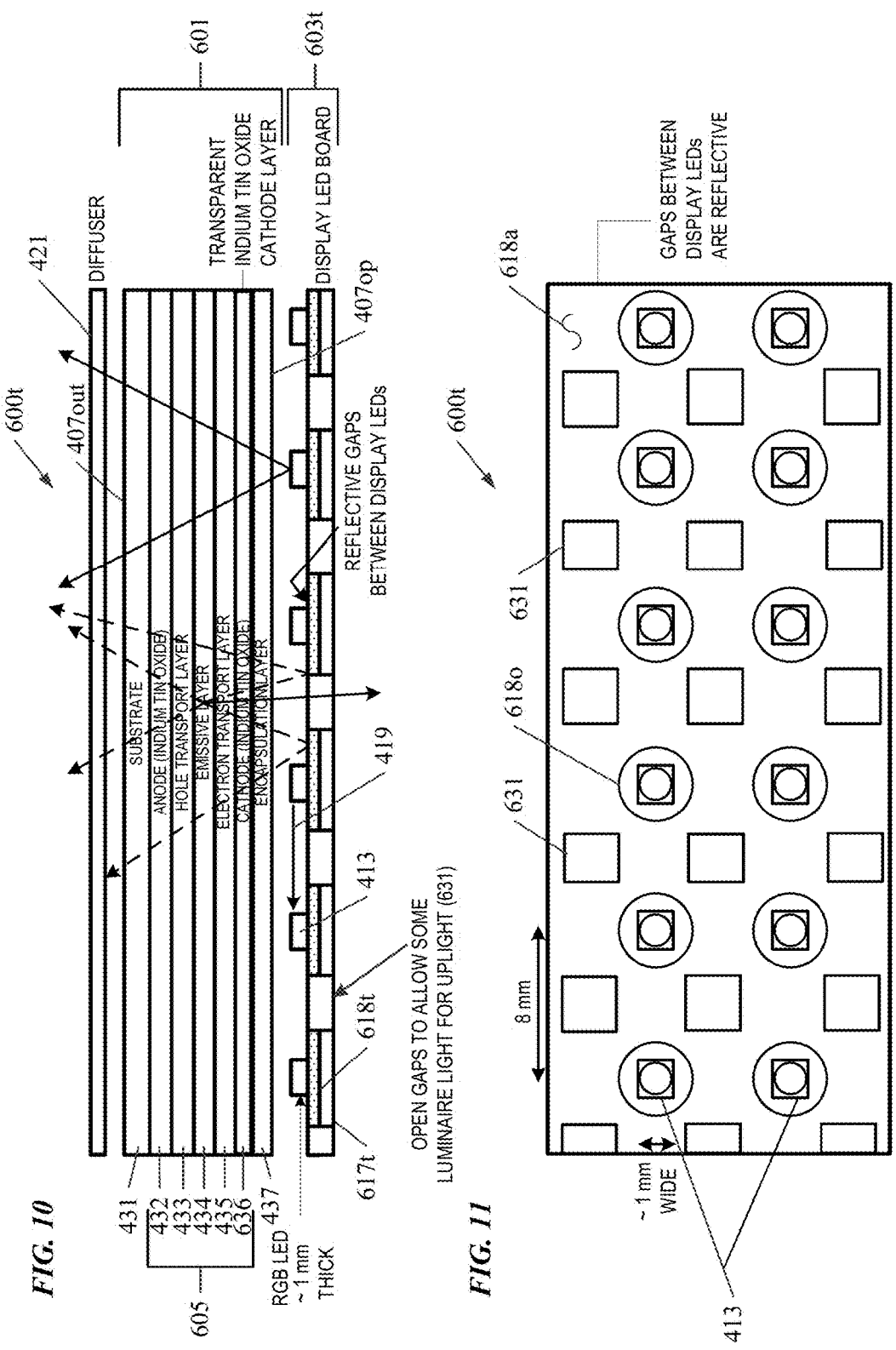

LUMINAIRE AND LIGHTING SYSTEM, COMBINING TRANSPARENT LIGHTING DEVICE AND DISPLAY COUPLED TO OUTPUT IMAGE VIA THE TRANSPARENT LIGHTING DEVICE

TECHNICAL FIELD

The present subject matter relates to examples of a luminaire that incorporates both a lighting and a display, where the lighting device is relatively transparent and a transmissive element of the lighting device is coupled to an output of the display device. The present subject matter also encompasses a system that includes such a luminaire.

BACKGROUND

Electrically powered artificial lighting has become ubiquitous in modern society. Electrical lighting equipment is commonly deployed, for example, in homes, buildings of commercial and other enterprise establishments, as well as in various outdoor settings.

In conventional luminaire, the luminance output can be turned ON/OFF and often can be adjusted up or dimmed down. In some devices, e.g. using multiple colors of light emitting diode (LED) type sources, the user may be able to adjust a combined color output of the resulting illumination. The changes in intensity or color characteristic of the illumination may be responsive to manual user inputs or responsive to various sensed conditions in or about the illuminated space.

There also have been proposals to use displays or display-like devices mounted in or on the ceiling to provide variable lighting. The Fraunhofer Institute, for example, has demonstrated lighting equipment using luminous tiles, each having a matrix of red (R) LEDs, green (G), blue (B) LEDs and white (W) LEDs as well as a diffuser film to process light from the various LEDs. The LEDs of the system were driven to simulate or mimic the effects of clouds moving across the sky. Although use of displays allows for variations in appearance that some may find pleasing, the displays or display-like devices are optimized for image output and do not provide particularly good illumination for general lighting applications. A display typically has a Lambertian output distribution over substantially the entire surface area of the display screen, which does not provide the white light intensity and coverage area at a floor or ceiling height offered by a similarly sized ceiling-mounted light fixture. Liquid crystal displays (LCD) also are rather inefficient. For example, backlights in LCD televisions have to produce almost ten times the amount of light that is actually delivered at the viewing surface. Therefore, any LCD displays that might be used as lighting products need to be more efficient than typical LCD displays for the lighting device implementation to be commercially viable.

Examples of other uses of lighting in combination with display technologies include various configurations of signage that include light sources as backlighting that are positioned behind a design feature such a diffuser or screen with an image or wording. Examples of such backlit signage includes advertising signs, door exit signs and other examples of signage that would benefit from backlighting. Some of the signs may be controllable to change wording or an image presented on the display device of the sign. In some instances of advertising signage, a transparent display can be used to provide advertising without obstructing a view of either the interior of a store when viewed from the exterior or vice versa, as well as providing an easily changeable design. However, backlit signage without additional lighting is not typically configured to provide general illumination that complies with governmental regulations and industry standards applicable to the environment in which the signage is installed.

Lighting equipment for illumination and displays for image output have fundamentally different requirements, for example, for consumer applications.

SUMMARY

Hence, there is room for further improvement in luminaires that offer both general illumination capabilities and controllable image display capabilities and systems that incorporate such luminaires. Examples of a lighting and display type luminaire use relatively transparent lighting devices. In such a luminaire, a light transmissive element of the lighting device is coupled to an output of a display device.

In a first example, a luminaire includes a controllable lighting device configured to generate light for an illumination application of the luminaire. At least a portion of a body of the lighting device is transmissive. The luminaire also includes a controllable display, coupled to supply light of a selectable image to at least the transmissive portion of the body of the lighting device for output as a visible image via the lighting device.

In a system example, a system has a luminaire that includes a lighting device and has a light emissive display. The system also includes circuitry coupled to the illumination light source and the light emissive display to drive and control operation of the illumination light source and the light emissive display. In this example, the lighting device includes a body with an illumination light output surface and an opposing surface opposite the output surface. The lighting device also includes a source of an illumination light coupled to or integrated into the body of the lighting device, configured to generate illumination light for emission through the output surface as light for an illumination application of the luminaire. At least some portions of the body of the lighting device are transmissive with respect to visible light. The light emissive display is coupled to supply light of an image to the opposing surface on the body of the lighting device for transmission through the body of the lighting device and output as a visible image via the output surface on the lighting device. The circuitry is configured to: operate the illumination light source to generate the illumination light during an illumination state of the luminaire, and operate the display to emit the light of the image during an image display state of the luminaire.

The relatively transparent lighting device may be implemented in a variety of ways. For example, an edge lit lighting device may include an optical waveguide and one or more illumination light sources coupled to supply light to/through surface along an edge or periphery of the waveguide. The waveguide allows emission of illumination light through a front surface. In this example, the display is coupled to a back surface of the waveguide. During display operations, the waveguide is sufficiently transparent to allow image display light to pass through the waveguide for emission through the front surface of the waveguide. Another example utilizes a light transmissive OLED (organic light emitting diode) panel as the relatively transparent lighting device.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

BRIEF DESCRIPTION OF THE DRAWINGS

The drawing figures depict one or more implementations in accordance with the present concepts, by way of example only, not by way of limitations. In the figures, like reference numerals refer to the same or similar elements.

FIG. 2 is a side or cross-sectional view, and FIG. 3 is a top plan view, of a section of an edge lit type transmissive lighting device and an associated LED type emissive display.

FIG. 10 is a side or cross-sectional view, and FIG. 11 is a top plan view, of a section of another example of an OLED type transmissive lighting device and associated LED type emissive display, in which the display also is at least somewhat light transmissive, for uplighting or similar applications.

DETAILED DESCRIPTION

Figure 1:
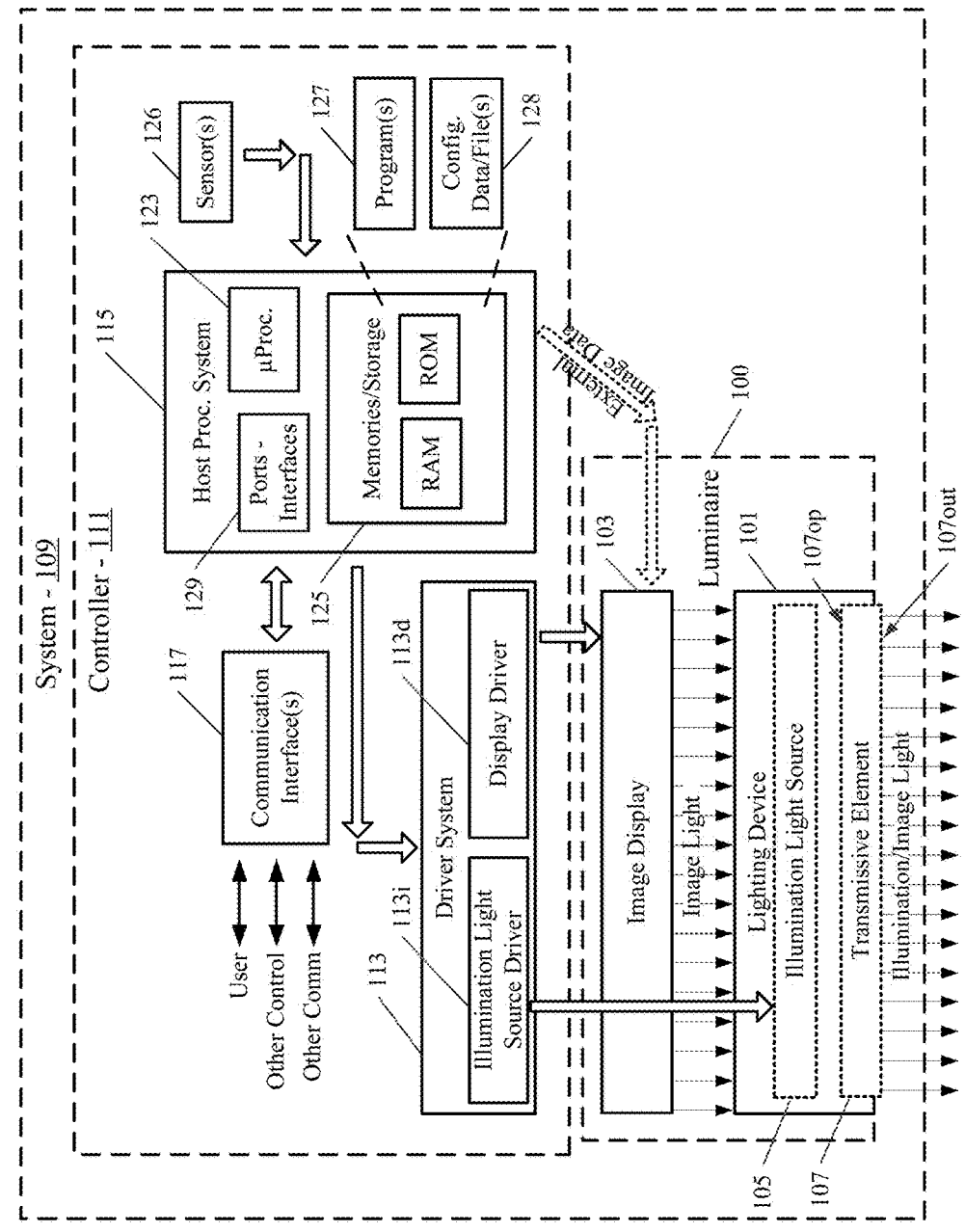
FIG. 1 is a functional block diagram of an example of a system in which a luminaire includes a lighting device for general illumination and an image display.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various examples disclosed herein relate to luminaires that offer both general illumination capabilities and controllable image display capabilities and systems that include such luminaires. Examples of a lighting and display type luminaire use relatively transparent lighting devices. In such a luminaire, a light transmissive element of the lighting device is coupled to an output of a display device.

Such a luminaire, for example, may enable either lighting with a fixed distribution, or a display showing a user selected image in a display state, by using the lighting component that is transparent and placed over the image-light output of a full color display.

The term "luminaire," as used herein, is intended to encompass essentially any type of device that processes energy to generate or supply artificial light, for example, for general illumination of a space intended for use of occupancy or observation, typically by a living organism that can take advantage of or be affected in some desired manner by the light emitted from the device. However, a luminaire may provide light for use by automated equipment, such as sensors/monitors, robots, etc. that may occupy or observe the illuminated space, instead of or in addition to light provided for an organism. However, it is also possible that one or more luminaires in or on a particular premises have other lighting purposes, such as signage for an entrance or to indicate an exit. In most examples, the luminaire(s) illuminate a space or area of a premises to a level useful for a human in or passing through the space, e.g. of sufficient intensity for general illumination of a room or corridor in a building or of an outdoor space such as a street, sidewalk, parking lot or performance venue. The actual source of illumination light in or supplying the light for a luminaire may be any type of artificial light emitting device, several examples of which are included in the discussions below.

Terms such as "artificial lighting," as used herein, are intended to encompass essentially any type of lighting that a device produces light by processing of electrical power to generate the light. A luminaire for an artificial lighting application, for example, may take the form of a lamp, light fixture, or other luminaire arrangement that incorporates a suitable light source, where the light source by itself contains no intelligence or communication capability, such as one or more LEDs or the like, or a lamp (e.g. "regular light bulbs") of any suitable type. The illumination light output of an artificial illumination type luminaire, for example, may have an intensity and/or other characteristic(s) that satisfy an industry acceptable performance standard for a general lighting application.

The luminaires discussed in further detail below support both artificial lighting for general illumination applications and controllable display capabilities. For that purpose, such a luminaire includes a lighting device for general illumination and a display for generating light forming an image output. The lighting device includes the source of illumination light within the luminaire. The lighting device or at least a portion/element thereof is transmissive or sufficiently transparent to enable light of the image from the display to pass through so that display image light output from the luminaire emerges from the same output surface as for illumination light output from the lighting device.

The term "coupled" as used herein refers to any logical, optical, physical or electrical connection, link or the like by which signals or light produced or supplied by one luminaire element are imparted to another coupled element. Unless described otherwise, coupled elements or devices are not necessarily directly connected to one another and may be separated by intermediate components, elements or communication media that may modify, manipulate or carry the light or signals.

In addition to a displayed image, light output from the luminaire may carry information, such as a code (e.g. to identify the luminaire or its location) or downstream transmission of communication signaling and/or user data. The light based data transmission may involve modulation or otherwise adjusting parameters (e.g. intensity, color characteristic or distribution) of the illumination light output from the luminaire and/or the image light output of the display device.

Reference now is made in detail to the examples illustrated in the accompanying drawings and discussed below. FIG. 1 illustrates an example of a luminaire 100 as part of a system 109 that also includes a controller 111. In the simplified block diagram example, the luminaire 100 includes a lighting device 101 and an image display 103.

The lighting device 101 is controllable to generate light for an illumination application of the luminaire 100. At least a portion of a body of the lighting device 101 is transmissive. To illustrate this point, the first drawing depicts a transmissive element 107 in the lighting device 101. Specific examples of transmissive elements to form portions of different at least partially transparent types of lighting devices are discussed in more detail below with regard to later drawings. The luminaire 100 also includes a source 105 of illumination light. Although shown separately for ease of illustration in the block diagram, the illumination light source 105 may be coupled to or integrated into the body of the lighting device 101, e.g. coupled to or integrated in/with the transmissive element 107. The illumination light source 105 is configured to generate illumination light for emission through an output surface of the lighting device 101 (downward in the illustrated example) as light for an illumination application of the luminaire 100. The lighting device 101, including for example the source 105, is configured to output sufficient visible light to support the illumination application of the luminaire 100, for example, to have an intensity and/or other characteristic(s) that satisfy an industry acceptable performance standard for a general lighting application without requiring concurrent light output from the image display 103.

As noted, the luminaire 100 also includes the image display 103. Display 103 is an emissive type display device controllable to emit light of a selected image, e.g. as a still image or a video frame. The image display 103 is coupled to supply light of the selectable image to at least the transmissive element 107 of the body of the lighting device 101 for output as a visible image via the lighting device 101.

In the example, the transmissve element 107 forms the body of the lighting device 101. The transmissve element 107 or body of the lighting device 101 has an illumination light output surface 107out and an opposing surface 107op opposite the output surface 107out. The illumination light source 105 may be coupled to or integrated into the body of the lighting device, as discussed in more detail later. Of note, the illumination light from the source 105 is output from the lighting device 101 via the output surface 107out. The light emissive type image display 103 is coupled to supply light of an image to the opposing surface 107op on the body (element 107 in the example) of the lighting device 101 for transmission through the body of the lighting device 101 and output as a visible image via the same output surface 107out on the lighting device 101.

In the example, the opposite surface 107op serves as the input surface of the transmissive element/body 107 of the lighting device 101, at least for image light from the display 103. Depending on the particular implementation of the lighting device 101, the opposite surface 107op also may serve as the input surface for light from the source 105, e.g. if the source 105 is itself transmissive with respect to light from the image display 103. An example of a transmissive light source 105 is a layer of one or a larger number of OLED type emitters. Alternatively, the source 105 may provide the illumination light to the transmissive element 107 at a different location, e.g. at a surface along a periphery (between edges of the surfaces 107out, 107op) of the transmissive element/body 107. Alternatively, the illumination light source 105 may be integrated within the light transmissive element 107.

The drawing (FIG. 1) also shows the inclusion of the example of the luminaire 100 in a system 109, together with an example of a suitable controller 111. As shown in FIG. 1, the controller 111 includes a driver system 113 coupled to the luminaire 100 and a host processor system 115. The controller 111 may also include one or more communication interfaces 117 and/or one or more sensors 126.

The controllable luminaire 101 produces general illumination lighting as well as visible light of an image display output in response to control signals received from the driver system 113. For that purpose, the example of the driver system 113 includes an illumination light source driver 113*i* configured and coupled to supply suitable power to drive the particular implementation of the light source 105, and the example of the driver system 113 includes display driver 113*d* configured and coupled to supply image display signals to the particular implementation of the display 103. In addition or alternatively, the image data to operate display 103 may be provided to the image display 103 from an external source(s) (not shown), such as a remote server or an external memory device via one or more of the communication interfaces 117 and the host processor system 115. Although shown separately, the drivers 113*i*, 113*d* of the system 113 may be formed by unified driver circuitry.

The image display 103 may be either a commercial-off-the-shelf image display or an enhanced display or the like specifically adapted for use in the luminaire 100. The image display 103 is configured to present an image. The presented image may be a real scene, a computer generated scene, a single color, a collage of colors, a video stream, animation or the like. The lighting device 101 may be an otherwise standard general illumination system, if suitably transmissive, which is co-located with and optically coupled to an output of the image display 103. Several examples of the luminaire in which the lighting device and/or the display are specifically configured for use together in a luminaire like 100 are discussed later with reference to FIGS. 2 to 7.

FIG. 1 also provides an example of an implementation of the high layer logic and communications elements to control luminaire operations to provide selected illumination light, e.g. for a general illumination application, and to provide a selected display image output. As shown in FIG. 1, the example 111 of the controller includes a host processing system 115, one or more sensors 121 and one or more communication interface(s) 117. Other implementations of the circuitry of the controller 111 may be utilized. For the purpose of illumination and display operation, the circuitry of the controller 111, in the example, is coupled to the illumination light source 105 and the light emissive display 103 to drive and control operation of the illumination light source 105 and the light emissive display 103. The circuitry of the controller 111 may be configured to operate the illumination light source 105 to generate the illumination light at least during an illumination state of the luminaire 100, and to operate the display 103 to emit the light of the image at least during an image display state of the luminaire 100.

The controller 111 may implement a number of different illumination/image display state configurations. For example, the circuitry of the controller 111 may be configured to implement the illumination state of the luminaire 100 and the image display state of the luminaire 100 as distinct, mutually exclusive states. With this state control strategy, the display 103 is not operative to emit the light of the image during the illumination state of the luminaire 100, and the illumination light source 105 is not operative to generate the illumination light from the device 101 during the image display state of the luminaire 100. In the illumination state, the intensity of the illumination light output of the luminaire 100 may be adjustable, e.g. dimmable. In the image display state, the intensity of the image light output of the luminaire 100 may be adjustable, e.g. to adapt image light output intensity to sensed ambient lighting conditions. The advantage of this mutually exclusive illumination state and display state approach is that since the source 105 is essentially off in the display state, there is no high intensity illumination light to 'wash out' the light of the image display output in the display state; however the illumination light can have a relatively high intensity for the illumination application in the illumination state.

An alternative state control strategy might implement the image display state of the luminaire or include an intermediate third state in which the illumination light source generates illumination light of a substantially reduced amount during the image display state of the luminaire in comparison to the amount of illumination light generated by the source during the illumination state illumination state of the luminaire. This intermediate state, for example may be useful for situations where it is desirable to convey some easily discernable information via the image output yet provide situation-related illumination, e.g. in an emergency situation where the image includes an arrow pointing to an exit (but a person does not need particularly crisp image output, e.g. does not need to read text from the image) and the illumination light is still of sufficient intensity to safely illuminate a passageway toward the exit (yet need not be so bright as for task lighting or the like).

Another state control strategy might implement an additional state of the luminaire 100 in which the illumination light source 105 generates illumination light concurrently with emission of the light of the image by the display 103. In this alternative state, the combined illumination and display light output, for example, could provide an even higher overall intensity for a specific lighting application.

The following table 1 represents an implementation of the system 109 in which the controller 111 allows selections among the various states outlined above.

memories/storage 125, such as a random access memory and/or a read-only memory, as well as programs 127 stored in one or more of the memories/storage 125. The programming 127, in one example, configures the system 109 to implement two or more of various display and illumination states of the controlled luminaire 100, as outlined above. As an alternative to distinct states, the programming 127 may configure the system 109 to implement a step-wise or substantially continuous adjustment of the relative intensities of the illumination light and image display light outputs of the controlled luminaire 100, encompassing settings to achieve the relative intensity levels of the states discussed above.

The memories/storage 125 may also store various data, including luminaire configuration information 128 or one or more configuration files containing such information, in addition to the illustrated programming 127. The host processing system 115 also includes a central processing unit (CPU), shown by way of example as a microprocessor (μP) 123, although other processor hardware may serve as the CPU.

The ports and/or interfaces 129 couple the processor 123 to various elements of the lighting system 109 logically outside the host processing system 115, such as the driver system 113, the communication interface(s) 117 and the sensor(s) 121. For example, the processor 123 by accessing programming 127 in the memory 125 controls operation of the driver system 113 and thus operations of the luminaire 100 via one or more of the ports and/or interfaces 129. In a similar fashion, one or more of the ports and/or interfaces 129 enable the processor 123 of the host processing system 115 to use and communicate externally via the interface(s) 117A; and the one or more of the ports 129 enable the processor 123 of the host processing system 115 to receive data regarding any condition detected by a sensor 121, for further processing.

In the operational examples, based on its programming 127, the processor 123 processes data retrieved from the memory 123 and/or other data storage, and responds to light

TABLE 1

Selectable Display and Illumination States

| No. | Luminaire State | State of Image Display 103 | State of Illumination Source 105 | Comment |
|---|---|---|---|---|
| 1 | Image Display Only | ON | OFF | Image Intensity may be adjustable |
| 2 | Illumination Only | OFF | ON | Dimmable Illumination |
| 3 | Display + Low Illumination | ON | Low On | Combination where illumination low enough to permit some image display |
| 4 | Display + Illumination | ON | ON | e.g. for MAX lighting, or for color tuning of illumination light |

Although described and shown in the table as distinct states, the lighting device 101 and display 103 may be controlled in a step-wise or continuous manner between respective minimum and maximum output intensity levels. In this later implementation, various states as outlined above would correspond to particular steps in the relative intensity settings or to particular points in the relative intensity continuum.

The host processing system 115 provides the high level logic or "brain" of the controller 111 and thus of the system 109. In the example, the host processing system 115 includes output parameters in the retrieved data to control the light generation by the source 105. The light output control also may be responsive to sensor data from a sensor 126. The light output parameters may include light intensity and light color characteristics of light from source. The light output parameters may also control modulation of the light output, e.g. to carry information on the illumination light output of the luminaire 100. The configuration file(s) 128 may also provide the image data, which the host processing system 115 uses to control the display driver 113d and thus the light emission from the image display 103.

As noted, the host processing system 115 is coupled to the communication interface(s) 117. In the example, the communication interface(s) 117 offer a user interface function or communication with hardware elements providing a user interface for the system 109. The communication interface(s) 117 may communicate with other control elements, for example, a host computer of a building control and automation system (BCAS). The communication interface(s) 117 may also support device communication with a variety of other equipment of other parties having access to the lighting system 109 in an overall/networked lighting system encompassing a number of systems 109, e.g. for access to each system 109 by equipment of a manufacturer for maintenance or access to an on-line server for downloading of programming instruction or configuration data for setting aspects of luminaire operation.

As outlined earlier, the host processing system 115 also is coupled to the driver system 113. The driver system 113 is coupled to the light source 105 and the image display 103. Although the driver system 113 may be a single integral unit or implemented in a variety of different configurations having any number of internal driver units, the example of system 113 includes separate general illumination source driver circuit 113i and image display driver circuit 1113d. The separate drivers may be circuits configured to provide signals appropriate to the respective type of light source 105 and/or display 103 utilized in the particular implementation of the luminaire 100, albeit in response to commands or control signals or the like from the host processing system 115.

The host processing system 115 and the driver system 113 provide a number of control functions for controlling operation of the lighting device 111, including in the illumination and image display states discussed earlier. In a typical example, execution of the programming 127 by the host processing system 115 and associated control via the driver system 113 configures the luminaire 100 to perform functions, including functions to operate the light source 105 to provide light output from the lighting system 112 and to operate the display 103 to output a selected image, e.g. based on the lighting device configuration information 128.

In an example of the operation of the lighting device 111, the processor 123 receives a configuration file 128 via one or more of communication interfaces 117. The processor 123 may store, or cache, the received configuration file 128 in storage/memories 125. The file may include image data, or the processor 123 may receive separate image data via one or more of communication interfaces 117. The image data may be stored, along with the received configuration file 128, in storage/memories 125. Alternatively, image data (e.g. video) may be received as streaming data and used to drive the display 103 in real-time.

The display driver 113d may deliver the image data directly to the image display 103 for presentation or may have to convert the image data into a signal or data format suitable for delivery to the image display 103. For example, the image data may be video data formatted according to compression formats, such as H. 264 (MPEG-4 Part 10), HEVC, Theora, Dirac, RealVideo RV40, VP8, VP9, or the like, and still image data may be formatted according to compression formats such as Portable Network Group (PNG), Joint Photographic Experts Group (JPEG), Tagged Image File Format (TIFF) or exchangeable image file format (Exif) or the like. For example, if floating point precision is needed, options are available, such as OpenEXR, to store 32-bit linear values. In addition, the hypertext transfer protocol (HTTP), which supports compression as a protocol level feature, may also be used. For at least some versions of the display 103 offering a low resolution image output, higher resolution source image data may be down-converted to a lower resolution format, either by the host processor system 115 or by processing in the circuitry of the driver 113d.

For illumination control, the configuration information in the file 128 may specify operational parameters of the controllable lighting device 101, such as light intensity, light color characteristic, and the like for light from the source 105. The processor 123 by accessing programming 127 and using software configuration information 128, from the storage/memories 125, controls operation of the driver system 113, and through that driver 113i controls the illumination light source 105, e.g. to achieve a predetermined illumination light output intensity and/or color characteristic for a general illumination application of the luminaire 100, including settings for the source 105 appropriate to the current one of the luminaire states discussed earlier.

A software configurable lighting system such as 109 may be reconfigured, e. g. to change the image display output and/or to change one or more parameters of the illumination light output, by changing the corresponding aspect(s) of the configuration data file 128, by replacing the configuration data file 128, or by selecting a different file from among a number of such files already stored in the data storage/memories 125A.

In other examples, the lighting system 109 may be programmed to transmit information on the light output from the luminaire 100. Examples of information that the system 109 may transmit in this way include a code, e. g. to identify the luminaire 100 and/or the lighting system 109 or to identify the luminaire location. Alternatively or in addition, the light output from the luminaire 100 may carry downstream transmission of communication signaling and/or user data. The information or data transmission may involve adjusting or modulating parameters (e. g. intensity, color characteristic or the like) of the illumination light output of the lighting device 101 or an aspect of the light output from the display 103. Transmission from the display 103 may involve modulation of the backlighting of the particular type of display. Another approach to light based data transmission from the display 103 may involve inclusion of a code representing data in a portion of a displayed image, e.g. by modulating individual emitter outputs. The modulation or image coding typically would not be readily apparent to a person in the illuminated area observing the luminaire operations but would be detectable by an appropriate receiver. The information transmitted and the modulation or image codding technique may be defined/controlled by configuration data or the like in the memories/storage 125. Alternatively, user data may be received via one of the interfaces 117 and processed in the controller 111 to transmit such received user data via light output from the luminaire 100.

Although specially configured circuitry may be used in place of microprocessor 123 and/or the entire host processor system 115, the drawing depicts an example of the controller 111 in which functions relating to the controlled operation of the system 109, including operation of the luminaire 100, may be implemented by the programming 127 and/or configuration data 128 stored in a memory device 125 for execution by the microprocessor 123. The programming 127 and/or data 128 configure the processor 123 to control system operations so as to implement functions of the system 109 described herein. Aspects of the software configurable system example therefore include "products" or "articles of manufacture" typically in the form of software or firmware that include executable code of programming 127 and/or associated configuration data 128 that is/are carried on or embodied in a type of machine readable medium. "Storage" type media include any or all of storage devices that may be used to implement the memory 125, any tangible memory of computers or the like that may communicate with the system 109 or associated modules of such other equipment. Examples of storage media include but are not limited to various semiconductor memories, tape drives, disk drives and the like, which may provide non-transitory storage at any time for the software or firmware programming 127 and/or the configuration data 128. All or portions of the programming and/or data may at times be communicated through the Internet or various other telecommunication networks. Such communications, for example, may enable loading of the programming and/or data from a computer or the like into the host processing system 115 of the controller 111, for example, from a management server or host computer of the lighting system service provider into a lighting system 109. Thus, another type of media that may bear the programming 127 and/or the data 128 includes optical, electrical and electromagnetic waves, such as used across physical interfaces between local devices, through wired and optical landline networks and over various airlinks. The physical elements that carry such waves, such as wired or wireless links, optical links or the like, also may be considered as media bearing the software. As used herein, unless restricted to non-transitory, tangible or "storage" media, terms such as computer or machine "readable medium" refer to any medium that participates in providing instructions to a processor for execution.

Apparatuses implementing functions like those of configurable lighting system 109 may take various forms. In some examples, some components attributed to the lighting system 109 may be separated from the device 101 and image display 103 of the luminaire 100. For example, a lighting system 109 may have all of the above hardware components on or within a single hardware platform as shown in FIG. 1 or in different somewhat separate units. In a particular example, one set of the hardware components may be separated from one or more instances of the controllable luminaire 100, e.g. such that one host processing system 115 may run several luminaires 100 each at a somewhat separate location wherein one or more of the luminaires 100 are at a location remote from the one host processing system 115. In such an example, a driver system 113 may be located near or included in a combined platform with each luminaire 100. For example, one set of intelligent components, such as the microprocessor 123, may control/drive some number of driver systems 113 and associated controllable luminaires 100. Alternatively, there may be one overall driver system 113 located at or near the host processor system 115 for driving some number of luminaires 100. It also is envisioned that some lighting devices may not include or be coupled to all of the illustrated elements, such as the sensor(s) 121 and the communication interface(s) 117. For convenience, further discussion of the system 109 of FIG. 1 will assume an intelligent implementation of the system 109 that includes at least the illustrated components.

In addition, the luminaire 100 of each lighting device 111 is not size restricted. For example, each luminaire 100 may be of a standard size, e. g. 2-feet by 2-feet (2×2), 2-feet by 4-feet (2×4), or the like, and arranged like tiles for larger area coverage. Alternatively, one luminaire 100 may be a larger area device that covers a wall, a part of a wall, part of a ceiling, an entire ceiling, or some combination of portions or all of a ceiling and wall.

Lighting equipment like that disclosed the examples of FIG. 1, may be used with various implementations of the luminaire 100. Although several examples of the luminaire implementations have been briefly discussed above, it may be helpful to consider some examples in more detail.

FIG. 2 is a side or cross-sectional view, and FIG. 3 is a top plan view, of a section of an edge lit type transmissive lighting device and an associated LED type emissive display. This type of lighting device is colloquially referred to as "edge" lit or as an "edge light" in that the source of illumination light is coupled to a periphery, e.g. around an edge, of a waveguide that outputs the illumination light. In actual implementations, such as that shown, one or more light emitters that together form the source of illumination light are coupled to one or more lateral surfaces along the periphery of the waveguide, for example, formed between peripheral edges of longitudinal surfaces of the waveguide.

In the example of FIGS. 2 and 3 based on edge lighting, the luminaire 200 includes a lighting device 201 and an image display 203. The lighting device 201 is controllable to generate light for an illumination application of the luminaire 200. The lighting device 201 includes a source 205 of illumination light and a light transmissive element, in this example, in the form of a substantially transparent waveguide 207.

FIGS. 2 and 3 depict an enlargement of a section of a luminaire 200, e.g. showing limited portions and/or numbers of relevant components. Also, the plan view (FIG. 3) shows a rectangular luminaire shape, although obviously the luminaire and appropriate components thereof may have other shapes, e.g. circular, oval square, hexagonal, etc. The drawings also show some representative examples of dimensions, although implementations of the luminaire may exhibit other sizes/dimensions.

The example includes a diffuser (221 in FIG. 2). For convenience, the plan view (FIG. 3) illustrates a view of components through a transparent implementation of the waveguide 207, e.g. as if the diffuser 221 is absent.

The source 205 of illumination light in the example includes a number of lighting LEDs 209, supported along the periphery of the waveguide 207 by one or more circuit boards 211. In a rectangular example like that shown, each of two circuit boards 211 support some number of the LEDs 209 along opposite lateral sides of the waveguide 207. In a typical LED based lighting device 201, the LEDs 209 may be white LEDs. In a tunable LED based lighting device 201, the LEDs 209 may be combinations of different types of LEDS, such as RGB (red/green/blue) LEDs, RBGW (red/green/blue/white) LEDs, or two or more types of white LEDs of different color temperatures. There may be only one LED, although as shown there typically are more LEDs 209. Other types of sources may be used, however, such as one or more organic light emitting diodes (OLEDs); one or more micro LEDs; one or more nanorod or nanowire LEDs; at least one fluorescent lamp; or at least one halogen lamp.

As noted, the luminaire 200 also includes the image display 203. Display 203 in the example is an emissive type display device, in that the display 203 emits light of the image rather than reflecting light to represent the image. The display 203 includes a number of pixels. In the example, each pixel has a number emitters for controllable emission of a corresponding number of different colors of light, e.g. RGB or RGBW. Although an OLED display, plasma display or other type of emissive display may be used, the example 203 uses a matrix of RGB LEDs 213. The LEDs 213 are supported by a grid 215, for example, at intersections of rows and columns of the grid 215. The grid 215 may be formed of suitable circuit board materials, to support the LEDs 215, provide connections to contacts of the LEDs as well also to run any necessary wiring from the drive circuitry to the LEDs 215. The circuit board(s) forming the grid 215 may also support some or all of the display driver circuitry. The image display 203 is coupled to supply light of the selectable image to at least the transmissive element 207 of the body of the lighting device 201 for output as a visible image via the lighting device 201.

Light waveguides, also sometimes referred to as "light guides" or "light pipes," are known in the lighting arts. A light waveguide utilizes internal reflections governed by Snell's Law. A light waveguide may be fabricated of a clear light transmitting material, such as clear plastic or glass or acrylic, having opposing surfaces (top and bottom surfaces in the drawing) between which the light is internally guided. The waveguide body also includes one or more lateral surfaces through which light can be introduced into the guide from one or more light sources coupled to the 'edge' surface(s). Because of the high angle of incidence (angle from an axis perpendicular to the respective surface) of light rays at the longitudinal surfaces of the waveguide body, the light rays will internally reflect off of these surfaces and consequently will not escape the guide. In this way, the internal reflections, at longitudinal surfaces of the guide structure, channel or guide light introduced at one or more lateral or peripheral surfaces along the body of the waveguide, often without emerging from the guide's lateral surfaces except at desired specially configured output locations.

In the example of FIG. 2, the light waveguide 207 therefore has a light transmissive body, an output surface 207out on the waveguide body, and an opposing surface 207op on the waveguide body opposite the output surface. The lighting LEDs 211 of the illumination light source 205 are optically coupled to supply illumination light to the waveguide via one or more waveguide input surfaces 207i for emission from the waveguide 207 via the output surface 207out as light for an illumination application of the luminaire. FIG. 2 shows dotted line/arrow examples of just few of the illumination light paths from a LED 211 on the left side of the drawing, through the waveguide 207 and out via the output surface 207out.

In the illustrated example, the body of the waveguide body is at least substantially planar. In the specific example shown, the longitudinal output surface 207out and the longitudinal opposite surface 207op are planar surfaces that are actually parallel to each other, although there may be some minor deviation due to the process of forming those surfaces of the material forming the body of the waveguide 207. There may also be applications in which either one or both surfaces on the body of the waveguide 207 has a non-planar contour, such as concave, convex or exhibiting a recurring waveform (e.g. sinusoidal or sawtooth).

One or more lateral waveguide input surfaces 207i extend along a periphery of the waveguide body including along at least a portion of each of the output surface 207out and the opposing surface 207op. Each waveguide input surface 207i extends between an edge of the output surface 207out and an edge of the opposite surface 207op along a portion of the periphery of the planar body of the waveguide 207. Various types of optical coupling techniques may be used along the waveguide input surface 207i to optimize the efficiency of extraction of light from the LEDs or the like forming the source 205 and coupling of such extracted light into the body of the waveguide 207. For example, the lighting device 201 may have an index of refraction matching material in between the emitter output of each LED 209 and a corresponding region of the light input surface 207i of the waveguide 207. The index of refraction of the material matches the index of refraction of the solid material (e.g. glass or acrylic) of the body of the waveguide 207. It may also be helpful to contour points on the light input surface 207i, e.g. with appropriate dimples, to conform to and provide improved optical coupling to the emissive surface of each illumination LED 209.

Light rays hitting a longitudinal surface 207our or 207op at an angle of incidence (relative to a line or axis perpendicular to the surface) greater than a critical angle of the particular material/structure of the waveguide 207 is reflected back within the waveguide 207, by total internal reflection (TIR). Light rays hitting a longitudinal surface at an angle of incidence less than the critical angle pass through the surface. In a pure waveguide arrangement, light introduced into the waveguide 207 on or about a line between and essentially parallel to the surfaces 207out, 207op of the waveguide (e.g. from emitters at locations similar to those shown for LEDs 213) may reflect one or more times and remain within the waveguide 207 across the entire longitudinal extent of the waveguide. If the opposite end of the waveguide also is reflective, light is reflected back and repeats the TIR channeling back in the opposite direction. For lighting applications or the like, features can be provided along one or both surfaces that change the reflective characteristic of the surface and the critical angle; and/or features provided along one or both surfaces may change the angle of light reflection within the waveguide and thus change the next angle of incidence of a light ray on a surface.

Hence, extraction of the illumination light from the waveguide 207 can be achieved by providing an optical mechanism for changing the manner in which the light rays pass through or reflect off one or the other of the longitudinal surfaces of the guide 207. Some extraction features may be provided at the output surface 207out; although in the example, diffuse optical processing is provided at the opposing surface 207op to decrease the angle of incidence of some light reaching the output surface. A variety of techniques for extracting light from a light waveguide are well known in the art.

In an example of diffuse reflection at the opposite surface, the opposing surface of the waveguide may have a layer of a light diffusing reflective material, which is bonded to this surface. For example, the bonded surface can be provided in the form of highly reflective diffuse paint, or a separate diffuse reflector element bonded to the surface by an optical adhesive having a reflective index that substantially matches the reflective index of the light waveguide. The surface may be treated to reduce internal reflectivity of the surface itself. The diffusely reflective layer changes the nature of the reflections at or from the opposing surface. The reflections are now diffuse in nature resulting in reflected light being scattered toward the output surface of the guide so as to increase the amount of light that strikes the output surface at low angles of incidence (closer to the perpendicular). The low angle incident light emerges from the output surface, which will cause the surface to illuminate and exhibit brightness. The component of diffused light coming off diffusely reflective material at high angles will continue to be piped down the waveguide for later diffusion and emission.

Other extraction techniques may be used. The example luminaire 200, with the incorporated display 203, utilizes a combination of extraction features 218 aligned with gaps 219 between the LEDs 213 forming the pixels of the matrix of the display 203 and diffuse reflectivity on portions (other than the LEDs 213) of the display 203.

The extraction features 218 in or associated with the waveguide 207 are aligned with the gaps 219, although the extraction features may not fully cover the respective gaps 219. The extraction features 218 may take the form of a treatment or structure formed in the waveguide 207 at the surface 207op, in appropriate regions of that surface 207op (hence, the illustration of the features 218 as being located within the waveguide 207 along and abutting the surface 207op). Extraction features could be frit produced by etching or the like, prismatic features, lens structures formed in or coupled to the surface, etc. formed in or located in an appropriate pattern along regions of the output surface 207op of the waveguide 207. The waveguide 207 thus may be described as a "patterned waveguide" with extraction features 218 of the pattern aligned with gaps 219 in the pixel matrix of the LED display 203. Other extraction technologies may be mounted on the outside of the waveguide 207 at appropriate locations on the surface 207op. The extraction features 218 break the TIR condition at the output surface 207op and allow light to couple out of waveguide 207, in this example, for reflection from reflective surfaces in the gaps (219) between display LEDs 213.

The reflectivity in the gaps 219 between the LEDs 213 at the pixels of the display 203 may be implemented in a variety of ways. In the example, surfaces of the column and row members of the grid 215 facing toward the surface 207op of the waveguide 207 may be reflective, e.g. coated with a reflective layer. In such an implementation, spaces between the column and row members of the grid 215 could be filled with a reflective material; or as in the example, the grid 215 may be backed by or supported on a suitable reflective element 217, such as a circuit board with a reflective coating layer on the surface (or surface portion(s)) thereof facing toward the surface 207op of the waveguide 207. The reflective material is highly reflective, for optimum efficiency; and the reflective material may be highly diffuse (e.g. Lambertian). For further discussion purposes, we will assume that the reflective material(s) forming the reflective element 217 provide white/diffuse reflectivity.

As outlined above, the illustrated example of the display 203 uses a grid 215 to support the LEDs 213. Other arrangements/configurations may be used to implement the LED based display. For example, the LEDs 213 may be mounted directly on a reflective board 217 (without the grid 215). In such an alternative implementation, wiring and possibly other circuitry may be provided on a back surface or on another board and connected to the LEDs 213 by conductors through vias extending through the board 217. In another approach, wiring lines connecting to the LEDs 213 may extend across the surface of the board 217 but be covered with a reflective layer in the areas where the LEDs are not mounted to the board.

A light ray from within the waveguide 207 hits an extraction feature 218 and passes through the surface 207op. The extraction feature 218 diffuses the ray as the ray passes through the surface 207op. Light the emerges through the surface 207op reflects off of the reflective surfaces in gaps (219) between display LEDs. This reflection may also tend to diffuse the light. The reflected light passes back through the feature 218 and may pass through other portions of the surface 207op into and through the transmissive body of the waveguide 207. Much of the reflected light has a smaller angle of incidence when transmitted through the waveguide 207 to the output surface 207out; and as a result, such light passes through surface 207out as illumination light output of the lighting device 201.

The extraction features 218 are distributed about the surface 207op and/or configured so as to promote uniform intensity output of the illumination light from the output surface 207out of the waveguide 207. For example, there typically is a space along each peripheral edge of the surface 207op that is free of any extraction feature, which helps mitigate against the appearance of high intensity ("hot spot") bands or regions along the edges of the output surface 207out of the waveguide 207. It may also be helpful to use features 218 of different sizes aligned with gaps 218 at different locations along the surface 207op, to increase uniformity of illumination light output. In the example, features 218 near the lateral edges adjoining the illumination light input surface are relatively small and fill less of the area corresponding to respective gaps 217. Approaching the center of the length (longitude) of the waveguide body, the size of the features 218 increases so as to fill more of the areas corresponding to respective gaps 217. In addition or instead of features of different sizes, the features at different locations across the surface may differ as to other extraction-related characteristics, e.g. more or less surface roughness (such as rougher features towards the middle).

Repeated light reflections, with attendant losses, within the waveguide 207 reduce the overall efficiency of the lighting device 201. The display LEDs 213 typically are not reflective, with respect to light from the opposite waveguide surface 207op, which leads to some loss of illumination light. Also, some light reflected from the reflective surfaces in gaps (219) between display LEDs 213 may reflect back off of the features 218 and/or areas of the surface 207op. Each reflection incurs some loss of illumination light. These losses between the waveguide surface 207op and the LEDs and reflective surfaces of the display 203 reduce the overall efficiency of the lighting device 201. Design of the elements of the luminaire 100 may be optimized and/or additional technologies added to reduce such losses and improve overall illumination efficiency of the luminaire 100.

The luminaire 100, in the example, further includes a diffuser 221, which further helps to homogenize output light for both illumination and image display. As shown in the drawing example, the diffuser 221 may be a separate sheet or layer, e.g. of a suitable white translucent material, adjacent to or formed on the output surface 207out of the waveguide 207. The diffuser 221, however, may be formed in other ways, for example, e.g. as frit produced by etching or the like, prismatic features, lens structures formed in or coupled to the surface, etc. across the output surface 207out of the waveguide 207.

For illumination, the diffuser 221 diffuses the illumination light output through the surface 207out, which improves uniformity of illumination light output intensity, as may be observed across the output through the surface 207out and/or as the illumination light is distributed at a working distance from the luminaire (e.g. across a floor or desktop).

For display, the diffuser 221 diffuses the image light from display 203 that has passed through the transmissive body of the waveguide 207. For some types/resolutions of the display, some degree of diffusion may be tolerable or even helpful. Use of higher resolution data to drive such an implementation of the display 203 may cause the image output to become pixelated. In some cases, the pixelation may prevent a person from perceiving the intended image on the display 203. Processing of the image data before application thereof to drive the pixel emitters of the display 203 and/or blurring of the output image by the diffuser 221 effectively blur discrete rectangles or dots of the pixelated image. Such blurring of the pixelated artifacts in the output image may increase an observer's ability to perceive or recognize the output image. An implementation of such a fuzzy pixels approach in a system 109 with a luminaire such as 200 may be implemented by a combination of downsampling of the image data and use of the diffuser 221 over the image display output via the surface 207out. Additional processing of the image data in the digital domain, e.g. Fourier transformation and manipulation in the frequency domain, may be implemented to reduce impact of low resolution image output on some types of display devices.

The example includes the diffuser 221, but the diffuser is optional. If not provided, the point sources of light, e.g. outputs from the LEDs 213, may be visible through the light transmissive body of the waveguide 207 and/or aspects of the extraction features 218.

In yet another approach without the separate diffuser, the output surface 207out may have a pattern of diffuse extraction features, with a some gaps between the surface portions aligned with the LEDs. There are multiple ways to implement the diffusion aspect of the fuzzy pixels concept by a combination of extraction features at the surface 207op and/or diffuser or pattern of diffusing features at or coupled to the output surface 207out.

Implementation of the luminaire 200 in a system, like system 109, would include circuitry like 113 coupled to the LEDs 209 of the source 205 and to the LEDs 213 of the image display 203 to drive and control operation of the source 205 and the light emissive display 203. In a manner similar to earlier discussions, the circuitry is configured to operate the lighting device 201 to generate the illumination light during an illumination state of the luminaire 200, and to operate the display 203 to emit the light of the image during an image display state of the luminaire 200.

The configurable luminaires 100 may be implemented using a variety of tranmsisive or transparent lighting device technologies. Several additional examples discussed below utilize various implementations of OLED (organic light emitting diode) panel type lighting devices.

Figure 4:
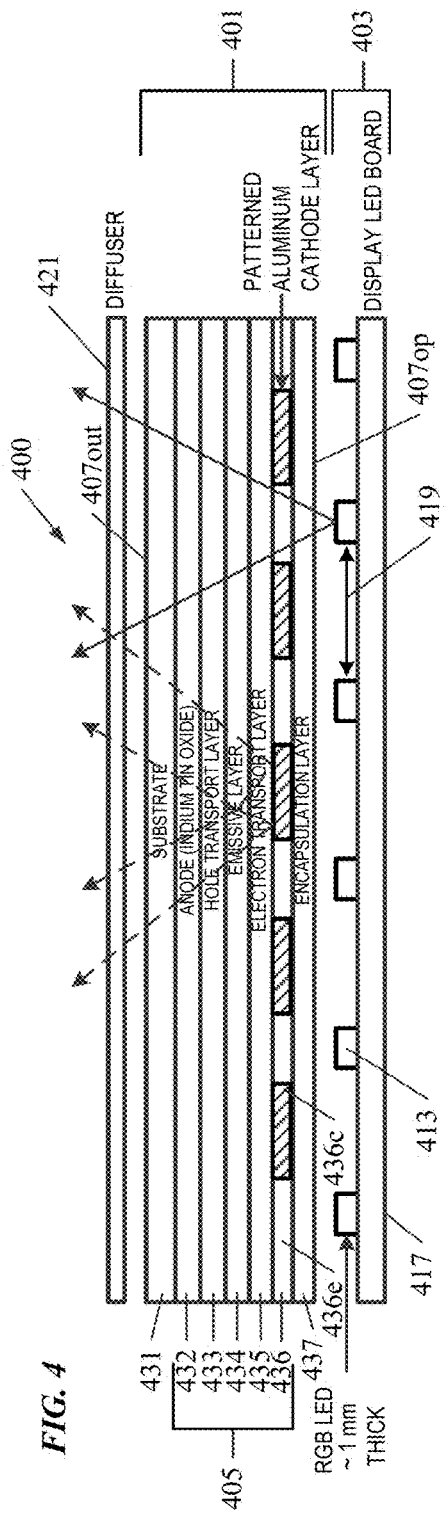
FIG. 4 is a side or cross-sectional view.
Figure 5:
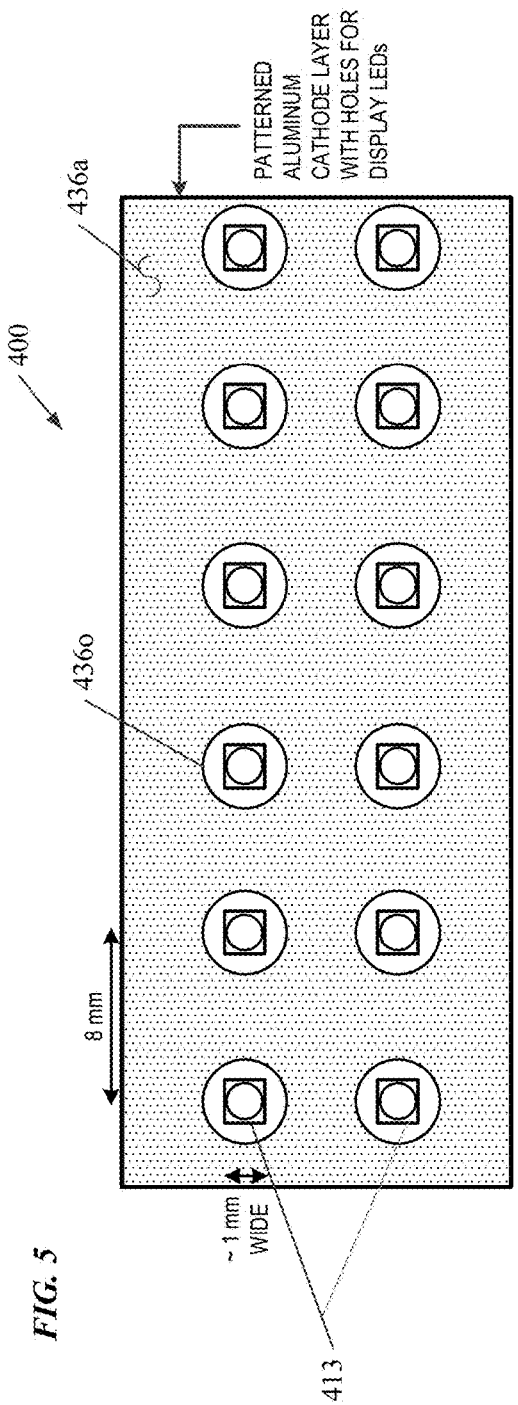
FIG. 5 is a top plan view, of a section of an example of an OLED type transmissive lighting device and an associated LED type emissive display.

FIG. 4 is a side or cross-sectional view, and FIG. 5 is a top plan view, of a section of an example of a luminaire 400, which includes an OLED based transmissive panel type lighting device 401 and an associated LED type emissive display 403. The OLED panel type lighting device 401 is controllable to generate light for an illumination application of the luminaire 400. The lighting device 401 in the OLED example includes an OLED 405 as the source of illumination light, in this example, formed as an integral element formed in the body of the lighting device 401.

The integral OLED type illumination light source 405 includes a number of layers forming one or more actual OLEDs. For discussion purposes, FIG. 4 shows one particular implementation example, although other OLED stack arrangements (e.g. a stack including multiple emissive, anode, cathode, and transport layers) may be used to implement a suitable OLED type illumination light source 405. Also in the example FIGS. 4 and 5, the integral illumination light source 405 includes layers forming a single OLED light emitter for illumination light, which extends at least substantially across a panel of the lighting device (e.g. across the lighting device output surface 407out and the opposite surface 407op). A multiple OLED configuration, as an alternate example, might include individual OLEDs forming a matrix of illumination pixels extending at least substantially across the panel area(s) of the lighting device 401.

The example of the lighting device 401 includes a substrate 431. The substrate 431 may be formed from glass, a highly transmissive plastic, etc. In the illustrated arrangement, the substrate 431 is on the output side of the stack. For example, a surface of the substrate 431 may form the light output surface 407out of the lighting device 401. The substrate 431 is formed of a relatively transmissive material, e.g. as transparent as possible to optimize light output through the surface 407out of the lighting device 401.

The OLED illumination light source 405 includes an anode 432. The anode 432 is formed of a relatively transparent conductive material, such as Indium-Tin-Oxide (ITO). In the example, the anode layer 432 extends across the substrate 431.

The OLED illumination light source 405 includes a hole transport layer 433 formed on the anode layer 432. The hole transport layer 433 is one of several organic semiconductor layers forming the diode of the OLED. The anode layer 432 provides electrical connectivity to the hole transport layer 433 of the diode of the OLED. The actual organic emissive semiconductor is formed as a layer 434 on the hole transport layer 433. An organic semiconductor is formed as an electron transport layer 435 on the light emissive layer 434 of the OLED. The layers 433 to 435 are the OLED layers forming the actual light emitting diode, in this particular example. Those familiar with OLEDs will appreciate that the actual OLED layers of the stack may include fewer or more layers, depending on the precise type and desired performance of the OLED type illumination light source 405.

An Aluminum cathode layer 436 provides electrical connectivity to the electron transport layer 435 of the diode of the OLED, e.g. the OLED layer opposite the first of the OLED layers 433 described above. The OLED stack (432 through 436), including the Aluminum cathode layer 436, is covered by a suitably transmissive/transparent encapsulation layer 437. The encapsulation layer 437 may be formed from glass, a highly transmissive plastic, etc.

Hence, the OLED illumination light source 405 may include layers of organic material situated between a transparent anode and a metallic cathode. The organic layers include the hole-transport layer 433, the emissive layer 434, and the electron-transport layer 435, in our example. When sufficient voltage is applied to the OLED, injected positive and negative charges combine in the emissive layer 434 to produce light. The brightness of the light is proportional to current flow. The dopant in the emissive layer 434 defines the visible color emitted. Different materials allow OLEDs to provide colors covering the visual spectrum, thereby obviating a need for filters. The absence of filters helps improve light transmission efficiency, thereby reducing power consumption.

One technique for generating white light in an OLED type illumination light source is through color mixing. In this regard, there are several color mixing techniques, all characterized by having multiple emitters in a single device. Some of the most common approaches to color mixing for generating white light via OLED include multi-layer structures of red, green, and blue emitters; energy transfer blends comprising a blue donor and red/orange acceptor; bimolecular complex emitters which produce exciplex and excimer states to broaden the emission; microcavity structures which tune the final emission via deconstructive interference; multi-pixel structures which combine multiple emissive regions into a single structure; and doping of a single emission layer with multiple emitters. Details of such implementations of the OLED are used and available in OLED lighting products and therefore are omitted from the drawings as such white OLED implementations should be fairly well understood by the skilled reader.

An alternate technique for generating white light is by wavelength conversion. In wavelength conversion, the emission from an ultraviolet or blue OLED is absorbed by one or more phosphors (not separately shown). The combined emission of the OLED and the phosphors provides a broad spectrum light output that appears white. Details of the wavelength conversion are omitted here as they should be fairly well understood by the skilled reader.

As noted, the luminaire 400 also includes the image display 403. Display 403 in the example is an emissive type display device, in that the display 403 emits light of the image rather than reflecting light to represent the image. The display 403 includes a number of pixels. In the example, each pixel has a number emitters for controllable emission of a corresponding number of different colors of light, e.g. RGB or RGBW. Although an OLED display, plasma display or other type of emissive display may be used, the example 403 uses a matrix of RGB LEDs 413, essentially similar to the LEDs of the display 203 in the example of FIGS. 2 and 3 discussed above. In the example of FIGS. 4 and 5, the LEDs 413 are mounted at appropriate locations on a circuit board 417 to form a pixel matrix for the display 403. The image display 403 is coupled to supply light of the selectable image to the body of the transparent lighting device 401, through surface 407op, for output as a visible image via the lighting device 401 through surface 407out. Wiring and possibly other circuitry may be provided on a back surface of board 417 or on another board and connected to the LEDs 413 by conductors through vias extending through the board 417. In another approach, wiring lines connecting to the LEDs 413 may extend across the surface of the board 417. Unlike the display 203, however; since the OLED utilizes the Aluminum of the cathode in layer 436 to provide desired reflectivity, the board 417 in the example may be free of additional reflective material.

The layers 433 to 435 forming the OLED are themselves relatively transmissive. Although there may be some loss, these layers are substantially transparent. The emissive layer 434 emits light in both directions. In a typical OLED panel, light generated/emitted away from the intended output surface 407out is reflected back toward that surface. If the cathode is formed by a metal, such as Aluminum in the example, the cathode layer 436 provides this reflectivity. Some degree of transmissivity through this layer 436 is desirable in the luminaire 400, however, to allow emission of light from the display 403 through the lighting device 401.

To provide the transmissivity through the lighting device 401, the Aluminum of the cathode layer 436 is patterned to provide optical passages in regions of layer 436 that are clear of the reflective Aluminum metal, aligned with outputs of the LEDs 413 of the display 403. The passages may be filled with a suitably transparent material 436e, for example, with some of the material used to form the transmissive/transparent encapsulation layer 437. The patterned sections 436c of the reflective Aluminum metal of the cathode layer 434 are in regions of layer 436 that are aligned with gaps 419 between the LED type emitters 413 of the display 403.

FIG. 4 shows the cathode as a patterned Aluminum layer, with electrode material at appropriate locations aligned with the gaps 419 between the LEDs 413 of the image display 403. Although effectively in a different layer in the OLED example, the patterned sections 436c of the Aluminum of the cathode layer 434 may be sized located across the body of the device 401 in a manner analogous to the sizes/locations of the extraction features 218 in the edge lit example of FIGS. 2 and 3. The pattern of the sections 436c, e.g. of particular sizes/locations, of the Aluminum of the cathode 436 can be designed to optimize illumination light distribution and/or distribution of image light output.

FIG. 5 generally is a plan view of the luminaire 400 as if the diffuser 421 were transparent or removed. This drawing, however also shows an alternate configuration of the Aluminum 436a of the cathode layer. In this example, the reflective Aluminum metal 436a extends substantially across the plane of the layer stack of the OLED light source 405 but has defined openings 436o (e.g. circular or other shaped holes through the Aluminum) in regions or at locations aligned with outputs of the LEDs 413 of the image display 403. The display light openings 436o through the Aluminum of the cathode are sized to allow for passage of a beam of light from a respective LED type emitter 413 at a pixel of the display, e.g. based on the distance from the LED and the expected beam diameter at that distance. In the arrangement of FIG. 5, the Aluminum cathode 436a still includes material at locations aligned to cover the gaps 419 between the LEDs 413 of the display 403, which reflect OLED emissions back toward the output surface 407out as discussed earlier. Light from the LEDs 413 of the display, however, would pass through the openings 436o of Aluminum cathode 436a of the layer 436 and thus through the other layers 431 to 435 of the lighting device 401, for image light emission through the output surface 407out of the device 401.

Layers of the OLED are thin, e.g. a few microns thick. For example, the distance between cathode 436 and the emissive layer 435 may be just a few μms or less. As a result, there is relatively little light loss in the stack over that small distance, and most of the OLED light emitted backward is efficiently reflected towards front (towards output surface 407out). Hence, the stack forming the lighting device 401 can be substantially thinner than the waveguide 207 in the edge lit luminaire 200. The thinner stack together with the use of an OLED that extends across the panel of the lighting device 401 reduces the need for extra diffusion to provide a degree of uniformity of the illumination light output. A diffuser 421, however, may be provided. Although not as significant for illumination uniformity, the diffuser 421 may help with a Fuzzy Pixel type processing, e.g. for a relatively low resolution of the image display 403.

Typically, OLEDs are not as efficient as inorganic LEDs often used in lighting, for example, as might be used as the source LEDs 209 in the edge lit luminaire 200 of FIGS. 2 and 3. Due to the thin layer sizes and the avoidance of coupling losses from the LEDs 209 into the waveguide 207, the overall illumination efficiency of the OLED based lighting device 601 may be close to or better than the edge lit lighting device 201.

As outlined above, the example of the lighting device 401 of FIGS. 4 and 5 includes an OLED panel type lighting device 401 as well as a controllable light emissive display 403. The image display 403 is coupled to supply light of the image to the opposing surface 407op of the OLED panel type lighting device 405 opposite the output surface 407out for transmission through the OLED panel lighting device 401 and output as a visible image via the output surface 407out of the OLED panel type lighting device 401.

Implementation of the luminaire 400 in a system, like system 109, would include circuitry like 113 coupled to an OLED 405 of the OLED panel type lighting device 401 and to the LEDs 413 of the light emissive display 403, to drive and control operation of the OLED type illumination light source 405 and the light emissive display 403. In a manner similar to earlier discussions, the circuitry is configured to operate the OLED panel type lighting device 401 to generate the illumination light during an illumination state of the luminaire 400, and to operate the display 403 to emit the light of the image during an image display state of the luminaire 400. Other operational states discussed earlier may be supported by the functions of the controller 111. Although a particular luminaire 400 using one or more OLED panel devices 401 may have a different size/number relationship between device(s) 401 and the display, the example, represents an arrangement in which there is one display 403 supplying image light through one OLED panel device 401 of similar dimensions.

Hence, the illustrated example of the luminaire 400 includes a lighting device 401 extending across the entire output of one corresponding display device 403. The stack of layers 432 to 437 in the example 401 forms a single OLED diode and associated electrodes, for a single illumination light source 405. As noted above, the stack may extend across and entire panel. Alternatively, particularly for larger panel structures, there may be a matrix of such OLEDs extending across the panel. Each individual OLED, in this later arrangement, would extend across a smaller portion or area (sub-panel) of the overall panel formed by the lighting device 401. By way of example of this later arrangement, a 1×1 lighting device panel (having a 1 foot by 1 foot light output area) may utilize a 4×4 OLED matrix aligned with 16 sub-panel areas of the output surface. Each OLED for one of the 16 sub-panel output areas would have a stack of layers 432 to 436 on common glass substrate 431 and be covered by encapsulation layer 437. The stacks would form 16 OLED diodes as light emitters, each having approximately a 3 inch by 3 inch area as a sub-panel output area that is part of the output surface 407out of the lighting device panel 401. Structurally, the OLED diodes in the matrix are isolated from each other and insolated where appropriate. Electrical connections are provided to the anodes and cathodes to connect the OLEDs of the matrix into one or more circuits for connections to a corresponding illumination light source driver. For example, there may be a connection to a drive channel for each OLED, the OLEDs may be connected into one or more parallel or serial strings, etc. The 1×1 lighting device panel is discussed by way of example; and the approaches outlined above are readily adaptable to other luminaire sizes smaller than the 1×1 lighting device panel, having different rectangular dimensions, having other shapes (e.g. circular, hexagonal, etc.), having larger standard luminaire sizes such as 2-feet by 2-feet (2×2), 2-feet by 4-feet (2×4), or the like.

Figure 6:
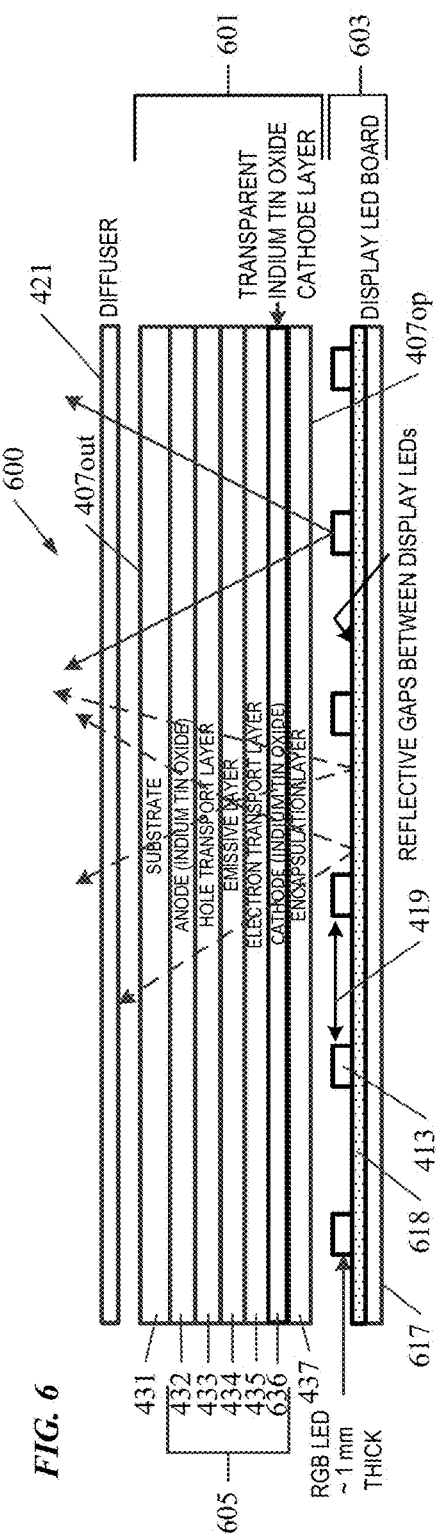
FIG. 6 is a side or cross-sectional view.
Figure 7:
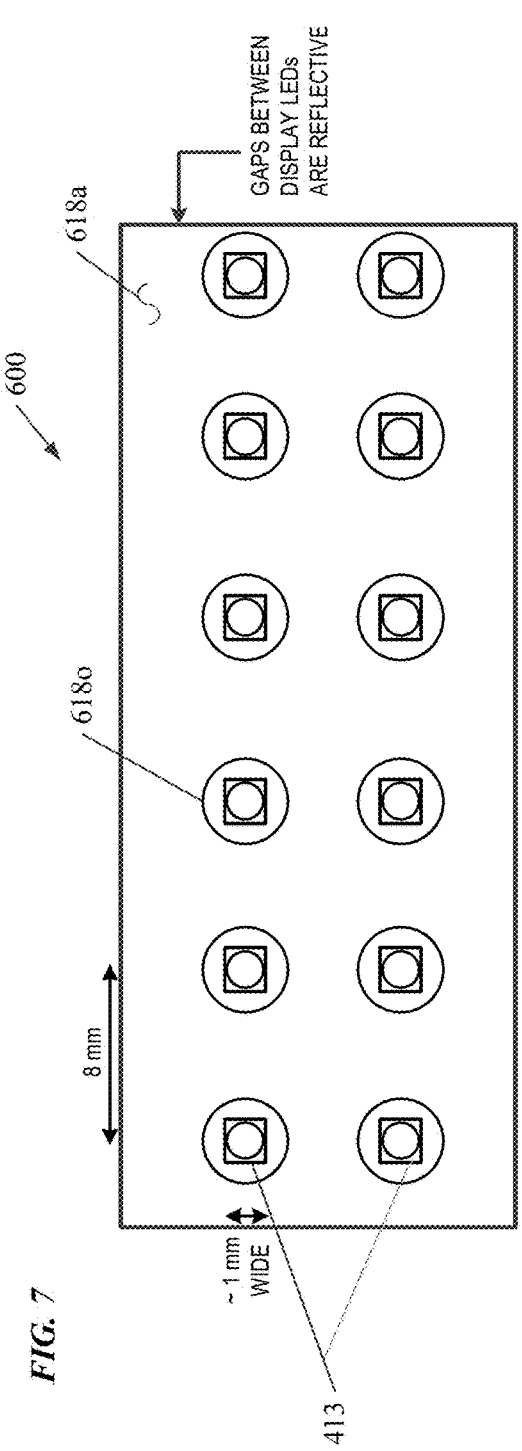
FIG. 7 is a top plan view, of a section of another example of an OLED type transmissive lighting device and associated LED type emissive display.

FIG. 6 is a side or cross-sectional view, and FIG. 7 is a top plan view, of a section of another luminaire example 600, which uses an OLED type transmissive lighting device 601 and associated LED type emissive display 603. The OLED panel type lighting device 601 is controllable to generate light for an illumination application of the luminaire 600. The lighting device 601 in the OLED example includes an OLED 605 as the source of illumination light, in this example, formed as an integral element formed in the body of the lighting device 601. These drawings depict a number of elements of the luminaire 600 that are essentially the same as and operate in a similar fashion as elements of the luminaire 400 in relation to FIGS. 4 and 5 above; and FIGS. 6 and 7 use the same reference numbers for those common elements. The description below concentrates on aspects of the luminaire 600 that are somewhat different, and further details of the structure and operation of the common elements are set forth in the discussion of the luminaire 400 in relation to FIGS. 4 and 5 above.

The lighting device 601 and included OLED illumination light source 605, for example, include elements 431 to 435 of the stack, as illustrated and discussed above. The illumination light source 605, utilizes a different cathode arrangement. In this example, the cathode 636 takes the form of a layer of transparent conductive material, such as ITO. The cathode 636 extends across the entire extent of the adjacent electron transport layer 435. Since the cathode 636 is transparent, the layer 636 can be continuous and may not have any passages or openings formed there-through.

As noted, the luminaire 600 also includes the image display 603. Display 603 in the example is an emissive pixel matrix type display device, as in the earlier examples. Although other emitters may be used, this example 603 likewise uses a matrix of RGB LEDs 613, essentially similar to the LEDs of the displays in the earlier examples discussed above. In the example of FIGS. 6 and 7, the LEDs 613 are mounted at appropriate locations on a circuit board 617 to form the pixel matrix for the display 603. The image display 603 is coupled to supply light of the selectable image to the body of the transparent lighting device 601, through surface 407op, for output as a visible image via the lighting device 601 through surface 407out. Unlike the display 403; however, since the OLED utilizes the ITO or the like to form a transparent cathode layer 636, the display includes a reflector 618 coated or otherwise mounted on the surface of the board 617 facing the lighting device 601. For example, the reflector 618 may be a layer of a light diffusing reflective material, formed on the appropriate surface of the board 617, such as a highly reflective diffuse paint or powder coating, or a separate diffuse reflector element bonded to the surface of the board 617. Light emitted from emissive layer 434 in any direction toward the display 603 is reflected back through the transparent lighting device 601 for illumination output via surface 407out.

The reflector 618 may not be a continuous sheet. As shown in FIG. 7, there may be some defined openings 618o, although the reflective material 618a of the reflector 618 extends substantially across the plane of the board 617. Although shown as circles surrounding but somewhat spaced from the respective LEDs 613, the display LED openings 618o through the reflector 618 may be as small and shaped as may be minimally appropriate to provide suitable places for mounting of the LEDs 613 on the board 617 and possibly for electrical connections to contacts of leads on the LEDs 613. The reflector 618 includes material 618a at locations including areas in the gaps 619 between the LEDs 413 of the display 603, which reflect OLED emissions back toward the output surface 407out as discussed earlier. Light from the LEDs 413 of the display mounted in the openings 618o, however, pass through the cathode 636 and other transparent layers/elements of the lighting device 601, for image light emission through the surface 407op and through the device 601 to the output surface 407out.

An ITO cathode implementation like that of FIGS. 6 and 7, however, may have more losses that the Aluminum cathode implementation of FIGS. 4 and 5, e.g. because of the transmission back and forth to/from the reflector 618 and the losses at the reflector.

In the specific examples shown in FIGS. 2 to 6 and described above, the display was not particularly transmissive or transparent. Substantial portions of the display area facing toward the lighting device are reflective to direct illumination light back through the transparent portion(s) of the lighting device. Some portions of the display may be relatively opaque, e.g. the areas of the LED emitters and any associated package hardware of the emitters. The present teachings, however, also encompass luminaires that utilize displays that may be somewhat transmissive or transparent.

The display could be a transparent OLED display, examples of which are disclosed in U.S. patent application Ser. No. 15/095,192, filed Apr. 11, 2016, entitled, LUMINAIRE UTILIZING A TRANSPARENT ORGANIC LIGHT EMITTING DEVICE DISPLAY, the disclosure of which is entirely incorporated by reference. Another transparent display approach might use a matrix of LEDs with a support structure having transparent gaps between the LEDS and between the support rows and columns of the grid pf the support structure, as disclosed for example in U.S. patent application Ser. No. 15/198,712, filed Jun. 30, 2016, entitled ENHANCEMENTS OF A TRANSPARENT DISPLAY TO FORM A SOFTWARE CONFIGURABLE LUMINAIRE, the disclosure of which is entirely incorporated by reference.

To appreciate application of such transparent displays in the context of the luminaires under consideration here, it may be helpful to consider some specific examples shown in FIGS. 8 to 11.

Figure 8:
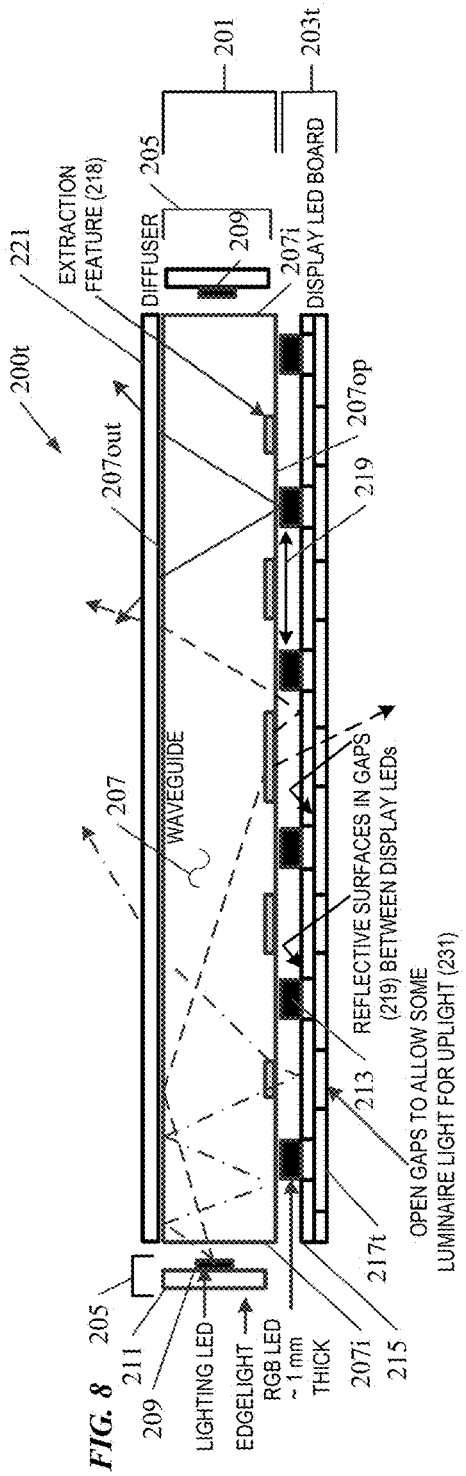
FIG. 8 is a side or cross-sectional view.
Figure 9:
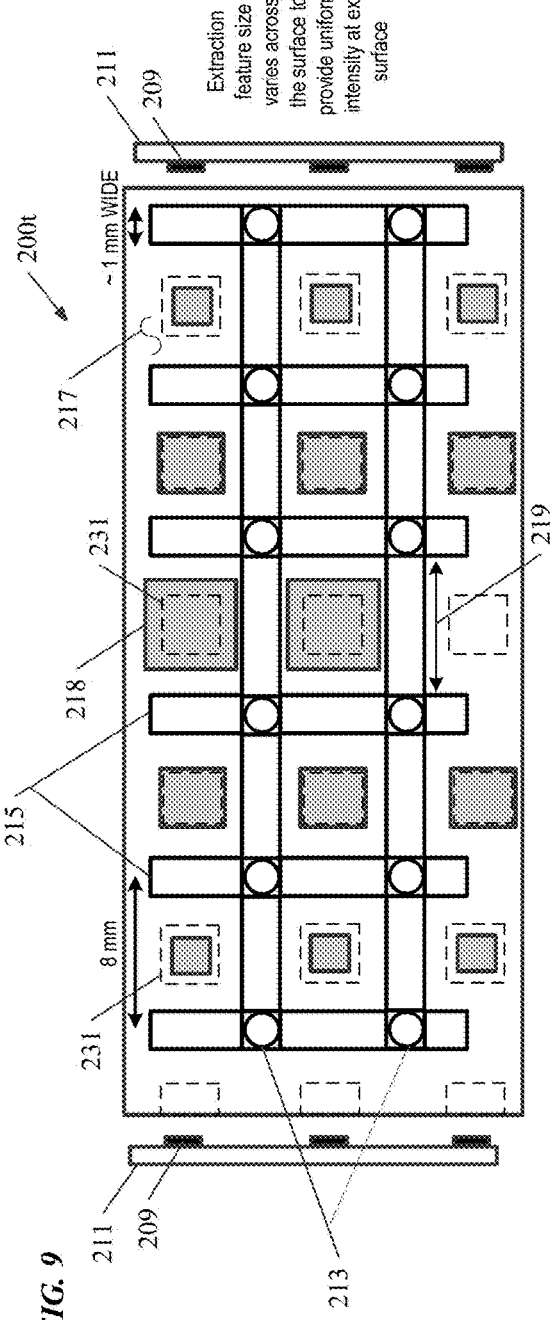
FIG. 9 is a top plan view, of a section of another example of an edge lit type transmissive lighting device and an associated LED type emissive display, in which the display also is at least somewhat light transmissive, for uplighting or similar applications.

With specific reference first to FIGS. 8 and 9, the example luminaire 200*t* in those drawings is similar to the luminaire 200 of FIGS. 2 and 3. FIGS. 8 and 9 generally use the same reference numbers to indicate the same luminaire elements as in FIGS. 2 and 3. For similarly numbered elements, the description of the elements of the luminaire 200 of FIGS. 2 and 3 should provide the reader with ample detailed description; and the discussion of FIGS. 8 and 9 here will concentrate on the different aspects of the luminaire 200*t*, particularly aspects that provide some light transmissivity through the display 203*t*.

Of note, in the example using the grid 215, the gaps 219 in the grid allow light to pass. The gaps in the grid are open and therefore transparent. The reflective element 217*t* is similar to the reflective element 217 of FIGS. 2 and 3, except that the reflective element 217*t* includes openings, apertures or gaps 231 through the reflective element 217*t* for transmission of light. The gaps 231 could be transparent sections of the board or the like used to form the reflective element 217*t*, but in the example, the gaps are physical openings passing through the structure used to form the reflective element 217*t*. In this way, the gaps 231 are open and therefore transparent. Although the reflective element 217*t* still reflects some illumination light back through the waveguide 207 forming the transparent body of the lighting device 201, some illumination light also emerges in the opposite direction through the gaps 231 of the partially transparent display 203*t*. If the luminaire 200*t* is oriented for a downlight application (opposite the orientation shown), the illumination output through the surface 207out and the diffuser 221 would provide downlight illumination in a manner analogous to the illumination output in the example of FIGS. 2 and 3. The illumination output via the gaps 231 of the partially transparent display 203*t* may provide an illumination output in an alternate, secondary direction, e.g. for uplight illumination.

The example of FIGS. 8 and 9 shows the gaps 231 as rectangles or squares (dotted lines in the plan view of FIG. 9) approximately aligned with the extraction features 218. The illustrated shape(s), relative sizes and placement of the gaps 231, however, are shown by way of non-limiting example, only. Other shapes, sizes and placements of the gaps 231 may be used, e.g. to provide intended relative amounts of illumination light output in the different (primary and secondary) illumination directions. Although not shown, additional diffusion may be provided in or near the gaps 231, e.g. to mitigate striations in the uplight output and/or to distribute the uplight output in a desirable manner.

Also, the example in the drawings represents an arrangement in which the gaps 231 are distributed fairly evenly across the area of the reflective element 217*t* of the display 203*t*. For some applications, it may be preferable to include gaps 231 at more limited, strategic locations, e.g. along some or all of the edges of the display 203*t* but not necessarily in the middle of the display 203*t*.

With specific reference next to FIGS. 10 and 11, the example luminaire 600*t* in those drawings is similar to the luminaire 600 of FIGS. 6 and 7. FIGS. 10 and 11 generally use the same reference numbers to indicate the same luminaire elements as in FIGS. 6 and 7. For similarly numbered elements, the description of the elements of the luminaire 600 of FIGS. 6 and 7 should provide the reader with ample detailed description; and the discussion of FIGS. 10 and 11 here will concentrate on the different aspects of the luminaire 600*t*, particularly aspects that provide some light transmissivity through the display 603*t*.

As in the earlier similar example 600, the luminaire 600*t* includes an image display 603*t* that has a matrix of RGB LEDs 413. In the example of FIGS. 10 and 11, the LEDs 413 are mounted at appropriate locations on a circuit board 617*t* to form the pixel matrix for the display 603*t*. The display 603*t* also includes a reflector 618*t* coated or otherwise mounted on the surface of the board 617*t* facing the lighting device 601. Of note, in the transparent display example 603*t*, the display includes openings, apertures or gaps 631 through the board 617*t* and the reflector 618*t*, for transmission of light. The gaps 631 could be transparent sections of the board and/or reflector, but in the example, the gaps are physical openings passing through the board 617*t* and the reflector 618*t*. In this way, the gaps 631 are open and therefore transparent.

In regions or gaps between the LEDs 413, the reflector 618*t* still reflects illumination light back through the transparent body of the lighting device 601, however, some illumination light also emerges in the opposite direction through the gaps 631 of the partially transparent display 603*t*. If the luminaire 600*t* is oriented for a downlight application (opposite the orientation shown), the illumination output through the surface 407out and the diffuser 421 would provide downlight illumination in a manner analogous to the illumination output in the example of FIGS. 6 and 7. The illumination output via the gaps 631 of the partially transparent display 603*t* may provide an illumination output in an alternate, secondary direction, e.g. for uplight illumination.

The example of FIGS. 10 and 11 shows the gaps 631 as rectangles or squares distributed fairly evenly across the area of the display 603*t*. The illustrated shape(s), relative sizes and placement of the gaps 631, however, are shown by way of non-limiting example, only. Other shapes, sizes and placements of the gaps 631 may be used, e.g. to provide intended relative amounts of illumination light output in the different directions. Also, for some applications, it may be preferable to include gaps 631 at more limited, strategic locations, e.g. along some or all of the edges of the display 203*t*. Although not shown, additional diffusion may be provided in or near the gaps 631, e.g. to mitigate striations in the uplight output and/or to distribute the uplight output in a desirable manner.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A system, comprising:
(I) a luminaire, including:
(A) a lighting device, including:
(i) a light waveguide having a light transmissive body, an output surface on the waveguide body, an opposing surface on the waveguide body opposite the output surface, and a waveguide input surface along a periphery of the waveguide body including along at least a portion of each of the output surface and the opposing surface; and
(ii) an illumination light source coupled to supply illumination light to the waveguide via the waveguide input surface for emission from the waveguide via the output surface as light for an illumination application of the luminaire; and
(B) a light emissive display, coupled to supply light of an image to the opposing surface on the waveguide body for transmission through the waveguide body and output as a visible image via the output surface on the waveguide body; and
(II) circuitry coupled to the illumination light source and the light emissive display to drive and control operation of the illumination light source and the light emissive display, the circuitry being configured to:
operate the illumination light source to generate the illumination light during an illumination state of the luminaire, and
operate the display to emit the light of the image during an image display state of the luminaire,
wherein the circuitry is configured to implement the illumination state of the luminaire and the image display state of the luminaire as mutually exclusive states, such that:
the display is not operative to emit the light of the image during the illumination state of the luminaire, and
the illumination light source is not operative to generate the illumination light during the image display state of the luminaire.

2. A system, comprising:
(I) a luminaire, including:
(A) a lighting device, including:
(i) a light waveguide having a light transmissive body, an output surface on the waveguide body, an opposing surface on the waveguide body opposite the output surface, and a waveguide input surface along a periphery of the waveguide body including along at least a portion of each of the output surface and the opposing surface; and
(ii) an illumination light source coupled to supply illumination light to the waveguide via the waveguide input surface for emission from the waveguide via the output surface as light for an illumination application of the luminaire; and
(B) a light emissive display, coupled to supply light of an image to the opposing surface on the waveguide body for transmission through the waveguide body and output as a visible image via the output surface on the waveguide body; and
(II) circuitry coupled to the illumination light source and the light emissive display to drive and control operation of the illumination light source and the light emissive display, the circuitry being configured to:
operate the illumination light source to generate the illumination light during an illumination state of the luminaire, and
operate the display to emit the light of the image during an image display state of the luminaire,
wherein the circuitry is configured to implement the image display state of the luminaire such that the illumination light source generates illumination light of a substantially reduced amount during the image display state of the luminaire in comparison to the amount of illumination light generated by the source during the illumination state illumination state of the luminaire.

3. The system of claim 1, wherein the circuitry is configured to implement an additional state of the luminaire in which the illumination light source generates illumination light concurrently with emission of the light of the image by the display.

4. The system of claim 1, wherein:
the waveguide body is at least substantially planar; and
the waveguide input surface extends between an edge of the output surface and an edge of the opposing surface along a portion of the periphery of the planar waveguide body.

5. The system of claim 1, wherein the illumination light source comprises one or more light emitters selected from the group consisting of:
one or more light emitting diodes (LEDs);
one or more organic light emitting diodes (OLEDs);
one or more micro LEDs;
one or more nanorod or nanowire LEDs;
at least one fluorescent lamp; and
at least one halogen lamp.

6. The system of claim 1, further comprising a diffuser associated with the output surface of the waveguide body.

7. The system of claim 6, wherein the diffuser comprises a sheet of diffusely transmissive material extending across the output surface of the waveguide body.

8. The system of claim 6, wherein the diffuser comprises a roughening of the output surface of the waveguide body.

9. A system, comprising:
(I) a luminaire, including:
 (A) a lighting device, including:
  (i) a light waveguide having a light transmissive body, an output surface on the waveguide body, an opposing surface on the waveguide body opposite the output surface, and a waveguide input surface along a periphery of the waveguide body including along at least a portion of each of the output surface and the opposing surface;
  (ii) an illumination light source coupled to supply illumination light to the waveguide via the waveguide input surface for emission from the waveguide via the output surface as light for an illumination application of the luminaire; and
  (iii) optical extraction features associated with the opposing surface of the waveguide, each extraction feature configured to allow some diffuse passage of light through the opposing surface;
 (B) a light emissive display, coupled to supply light of an image to the opposing surface on the waveguide body for transmission through the waveguide body and output as a visible image via the output surface on the waveguide body, wherein:
  the display comprises pixels, each pixel comprising a plurality of emitters, and
  the extraction features are located at positions of the opposing surface optically aligned with gaps between pixels of the display; and
(II) circuitry coupled to the illumination light source and the light emissive display to drive and control operation of the illumination light source and the light emissive display, the circuitry being configured to:
 operate the illumination light source to generate the illumination light during an illumination state of the luminaire, and
 operate the display to emit the light of the image during an image display state of the luminaire.

10. The system of claim 9, further comprising a diffusely reflective layer optically coupled to the opposing surface, at least at locations for reflecting light from the extraction features back through the opposing surface into the waveguide body.

11. The system of claim 1, wherein the display is at least partially light transmissive, to allow some illumination light output in a secondary direction different from direction of light output via the output surface on the lighting device.

12. A system, comprising:
(I) a luminaire, including:
 (A) an organic light emitting diode (OLED) panel type lighting device configured to emit illumination light via an output surface; and
 (B) a light emissive display, coupled to supply light of an image to an opposing surface of the OLED panel type lighting device opposite the output surface for transmission through the OLED panel lighting device and output as a visible image via the output surface of the OLED panel type lighting device; and
(II) circuitry coupled to an OLED of the OLED panel type lighting device and to the light emissive display to drive and control operation of the OLED and the light emissive display, the circuitry being configured to:
 operate the OLED panel type lighting device to generate the illumination light during an illumination state of the luminaire, and
 operate the display to emit the light of the image during an image display state of the luminaire.

13. The system of claim 12, wherein the OLED panel type lighting device comprises:
a plurality of OLED layers;
a transparent anode layer adjacent to and providing connectivity to a first one of the OLED layers; and
a reflective metal cathode layer adjacent to and providing connectivity to an opposite second one of the OLED layers, the metal cathode layer having metal in regions aligned with gaps between emitters of the display and regions clear of metal aligned with the emitters of the display.

14. The system of claim 12, wherein the OLED panel type lighting device comprises:
a plurality of OLED layers;
a transparent anode layer adjacent to and providing connectivity to a first one of the OLED layers; and
a reflective metal cathode layer adjacent to and providing connectivity to an opposite second one of the OLED layers, the metal cathode layer extending across a surface of the second one of the OLED layers and having defined openings aligned with emitters of the display.

15. The system of claim 12, wherein the OLED panel type lighting device comprises:
a plurality of OLED layers;
a transparent anode layer adjacent to and providing connectivity to a first one of the OLED layers; and
a transparent cathode layer adjacent to and providing connectivity to an opposite second one of the OLED layers,
wherein the display comprises a reflector at least in gaps between emitters of the display.

16. The system of claim 12, further comprising a diffuser associated with the output surface of the OLED panel type lighting device.

17. The system of claim 12, wherein the display is at least partially light transmissive, to allow some illumination light output in a secondary direction different from direction of light output via the output surface on the OLED panel type lighting device.

18. The system of claim 2, wherein:
the waveguide body is at least substantially planar; and
the waveguide input surface extends between an edge of the output surface and an edge of the opposing surface along a portion of the periphery of the planar waveguide body.

19. The system of claim 2, wherein the illumination light source comprises one or more light emitters selected from the group consisting of:
one or more light emitting diodes (LEDs);
one or more organic light emitting diodes (OLEDs);
one or more micro LEDs;
one or more nanorod or nanowire LEDs;
at least one fluorescent lamp; and
at least one halogen lamp.

20. The system of claim 2, further comprising a diffuser associated with the output surface of the waveguide body.

21. The system of claim 20, wherein the diffuser comprises a sheet of diffusely transmissive material extending across the output surface of the waveguide body.

22. The system of claim 20, wherein the diffuser comprises a roughening of the output surface of the waveguide body.

23. The system of claim 2, wherein the display is at least partially light transmissive, to allow some illumination light output in a secondary direction different from direction of light output via the output surface on the lighting device.

24. The system of claim 9, wherein:
the waveguide body is at least substantially planar; and
the waveguide input surface extends between an edge of the output surface and an edge of the opposing surface along a portion of the periphery of the planar waveguide body.

25. The system of claim 9, wherein the illumination light source comprises one or more light emitters selected from the group consisting of:
one or more light emitting diodes (LEDs);
one or more organic light emitting diodes (OLEDs);
one or more micro LEDs;
one or more nanorod or nanowire LEDs;
at least one fluorescent lamp; and
at least one halogen lamp.

26. The system of claim 9, wherein the display is at least partially light transmissive, to allow some illumination light output in a secondary direction different from direction of light output via the output surface on the lighting device.

* * * * *